United States Patent
Cho et al.

(10) Patent No.: US 8,658,051 B2
(45) Date of Patent: Feb. 25, 2014

(54) LITHOGRAPHY RESOLUTION IMPROVING METHOD

(75) Inventors: Kuo-Yao Cho, Da-An Shiang (TW); Wen-Bin Wu, Longtan Township, Taoyuan County (TW); Ya-Chih Wang, Yonghe (TW); Chiang-Lin Shih, Linkou Township, Taipei County (TW); Chao-Wen Lay, Gongguan Township, Miaoli County (TW); Chih-Huang Wu, Taoyuan (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 1326 days.

(21) Appl. No.: 12/119,275

(22) Filed: May 12, 2008

(65) Prior Publication Data
US 2009/0233448 A1 Sep. 17, 2009

(30) Foreign Application Priority Data

Mar. 11, 2008 (TW) ................ 97108588 A

(51) Int. Cl.
*C23F 1/00* (2006.01)
*B44C 1/22* (2006.01)
*H01L 21/306* (2006.01)

(52) U.S. Cl.
USPC ............ 216/62; 216/41; 430/316; 250/492.2; 250/492.3; 438/705

(58) Field of Classification Search
USPC ......... 216/41, 62; 430/316; 250/492.2, 492.3; 438/705
See application file for complete search history.

(56) References Cited

U.S. PATENT DOCUMENTS

| | | | |
|---|---|---|---|
| 6,444,404 B1 * | 9/2002 | Chen et al. | 430/314 |
| 6,774,043 B2 * | 8/2004 | Yamaguchi et al. | 438/705 |
| 6,797,552 B1 * | 9/2004 | Chang et al. | 438/197 |
| 6,828,202 B1 * | 12/2004 | Horch | 438/302 |
| 2002/0052082 A1 * | 5/2002 | Lee et al. | 438/262 |
| 2003/0224252 A1 * | 12/2003 | Zhou et al. | 430/5 |
| 2006/0270230 A1 * | 11/2006 | Abatchev et al. | 438/689 |
| 2008/0076070 A1 * | 3/2008 | Koh et al. | 430/311 |

* cited by examiner

*Primary Examiner* — Shamim Ahmed
(74) *Attorney, Agent, or Firm* — Volpe and Koenig PC

(57) ABSTRACT

A method of improving lithography resolution on a semiconductor, including the steps of providing a substrate on which a protecting layer, a first etching layer and a photoresist layer are sequentially formed; patterning the photoresist layer to form an opening so as to partially reveal the first etching layer; implanting a first ion into the revealed first etching layer to form a first doped area; and implanting a second ion into the revealed first etching layer to form a second doped area, wherein the first doped area is independent from the second doped area is provided.

14 Claims, 7 Drawing Sheets

LITHOGRAPHY RESOLUTION IMPROVING METHOD

FIELD OF THE INVENTION

The present invention relates to a method of improving the lithography resolution, in particular, to improve the lithography resolution for a semiconductor fabricating process.

BACKGROUND OF THE INVENTION

At present, with the prosperous growth to the consuming electrical products, the current trend of consumers' demand and need for the dimension of such products is almost towards small size and delicacy design. In order to substantially improve the sophistication during the fabricating process for a semiconductor and to shrink the scale of these products, a lithography process in a semiconductor fabricating process becomes very critical. That is, if the resolution of a lithography process could be further improved to reduce the analytic coefficient k1, the critical dimension in the succeeding fabricating steps could correspondingly become smaller so that a finer and more sophisticated semiconductor product is then obtainable.

Due to the contribution of an excimer laser, the resolution of lithography is propelled to the scale around 100 nm (nanometer) and even the critical dimension of a node is further pushed to the scale around 45 nm. However, once the lithography resolution is reduced to the scale around 0.25 nm or even lower than 0.25 nm, because of the inherent limitation of the optical characteristic, the optical lithography technique at the present state is inapplicable.

In order to overcome the mentioned defects in the existing lithography technique and to simultaneously improve the resolution of a lithography process, a method of improving the lithography resolution for a semiconductor is provided.

SUMMARY OF THE INVENTION

According to the first aspect of the present invention, a method of improving lithography resolution on a semiconductor, including the steps of providing a substrate on which a protecting layer, a first etching layer and a photoresist layer are sequentially formed; patterning the photoresist layer to form an opening so as to partially reveal the first etching layer; implanting a first ion into the revealed first etching layer to form a first doped area; and implanting a second ion into the revealed first etching layer to form a second doped area, wherein the first doped area is independent from the second doped area is provided.

Preferably, the substrate is formed by a base and a second etching layer, the second etching layer is formed on the base, and the protecting layer is formed on the second etching layer.

Preferably, the method further including steps of removing the photoresist layer; and partially removing the first etching layer to reveal the protecting layer.

Preferably, the method further including steps of forming an insulating layer on the first doped area and the second doped area respectively; and partially removing the protecting layer and the second etching layer.

Preferably, the insulating layer is formed by an oxidation process.

Preferably, the first doped area has a first width and the second doped area has a second width which is the same as that of the first width.

Preferably, the first etching layer has a covered area formed under the patterned photoresist layer and a reserved area formed between the first doped area and the second doped area.

Preferably, the first doped area, the second doped area, the covered area and the reserved area are formed with an identical width.

Preferably, the opening has a width three times larger than that of the covered area.

Preferably, the photoresist layer includes an anti-reflection coating on the first etching layer.

Preferably, each of the first ion and the second ion is selected from a group consisting of a phosphate ion, an arsenic ion, an inert gas ion and a combination thereof.

According to the second aspect of the present invention, a method of manufacturing a semiconductor device, including the steps of patterning a photoresist layer to partially reveal an etching layer thereunder; implanting a first ion into the revealed etching layer with a first incidence to form a first doped area; and implanting a second ion into the revealed etching layer with a second incidence to form a second doped area, wherein the first doped area is apart from the second doped area is provided.

Preferably, the etching layer is formed on a protecting layer disposed on a substrate.

Preferably, the first incidence is independent from the second incidence.

According to the third aspect of the present invention, a method of manufacturing a semiconductor device, including the steps of patterning a photoresist layer to partially expose an etching layer thereunder; and performing a plurality of ion implantation processes each with an incidence independent from the others to form a plurality of doped areas in the etching layer independent from one another is provided.

The foregoing and other features and advantages of the present invention will be more clearly understood through the following descriptions with reference to the drawings:

DETAILED DESCRIPTION OF THE PREFERRED EMBODIMENT

The present invention will now be described more specifically with reference to the following embodiments. It is to be noted that the following descriptions of preferred embodiments of this invention are presented herein for the aspect of illustration and description only, it is not intended to be exhaustive or to be limited to the precise form disclosed.

Figure 1:
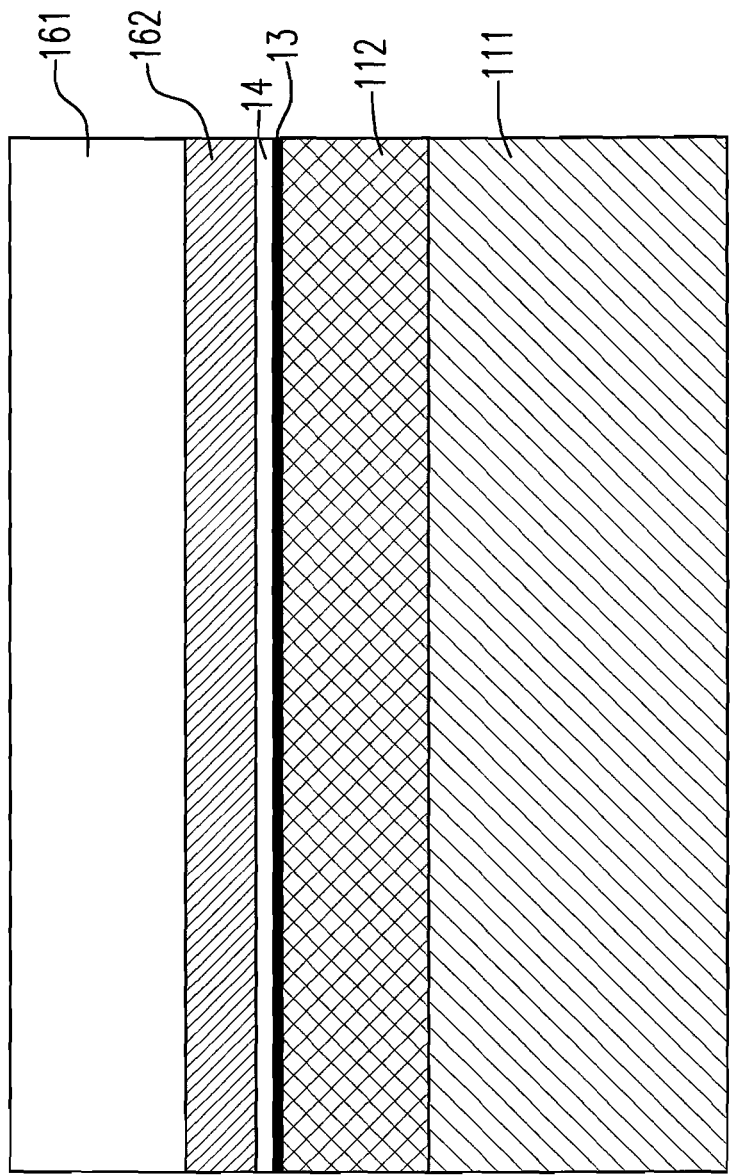
FIG. 1 is a diagram illustrating a lateral profile for the initial semiconductor structure according to the present invention.

Please refer to FIG. 1, which is a diagram illustrating a lateral profile for the initial semiconductor structure according to the present invention. From the bottom to the top, the initial semiconductor structure 10 disclosed in FIG. 1 includes a base 111, a second etching layer 112, a protecting layer 13, a first etching layer 14, a bottom anti-reflective coating (BARC) layer 162 and a photoresist layer 161. In the present semiconductor field, the base 111 is usually a silicon layer; the first etching layer 14 and the second etching layer 112 are usually polysilicon; the protecting layer 13 used for the purpose of preventing that the doped ions infiltrate into the second etching layer is usually the silicon nitride (SiN). A substrate includes the base 111 and the second etching layer 112.

Figure 2:
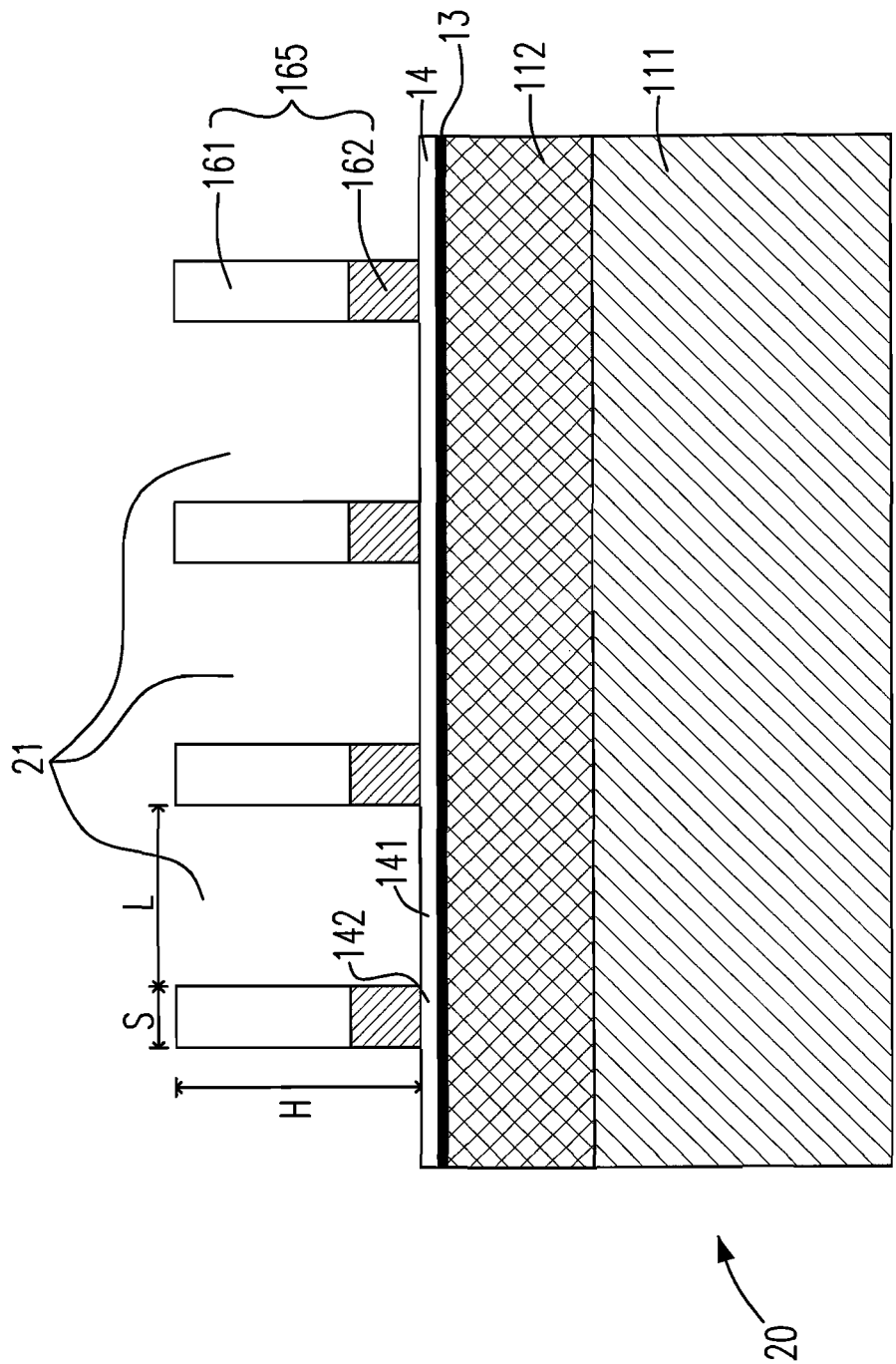
FIG. 2 is a diagram illustrating a lateral profile for the patterned semiconductor structure made by a lithography process according to the present invention.

Subsequently, please refer to FIG. 2, which is a diagram illustrating a lateral profile for the patterned semiconductor structure made by a lithography process according to the present invention. A lithography process is performed to remove parts of the BARC layer 162 and the photoresist layer 161 as shown in FIG. 2 by etching. The patterned semiconductor structure 20 shown in FIG. 2 includes a photoresist wall 165 consisted of the BARC layer 162 and the photoresist layer 161 and an opening 21. The BARC layer 162 and the photoresist layer 161 are remainings after etching. The first etching layer 14 at the opening 21 is a bottom area 141 and the first etching layer 14 under the photoresist wall 165 is a covered area 142.

Figure 3:
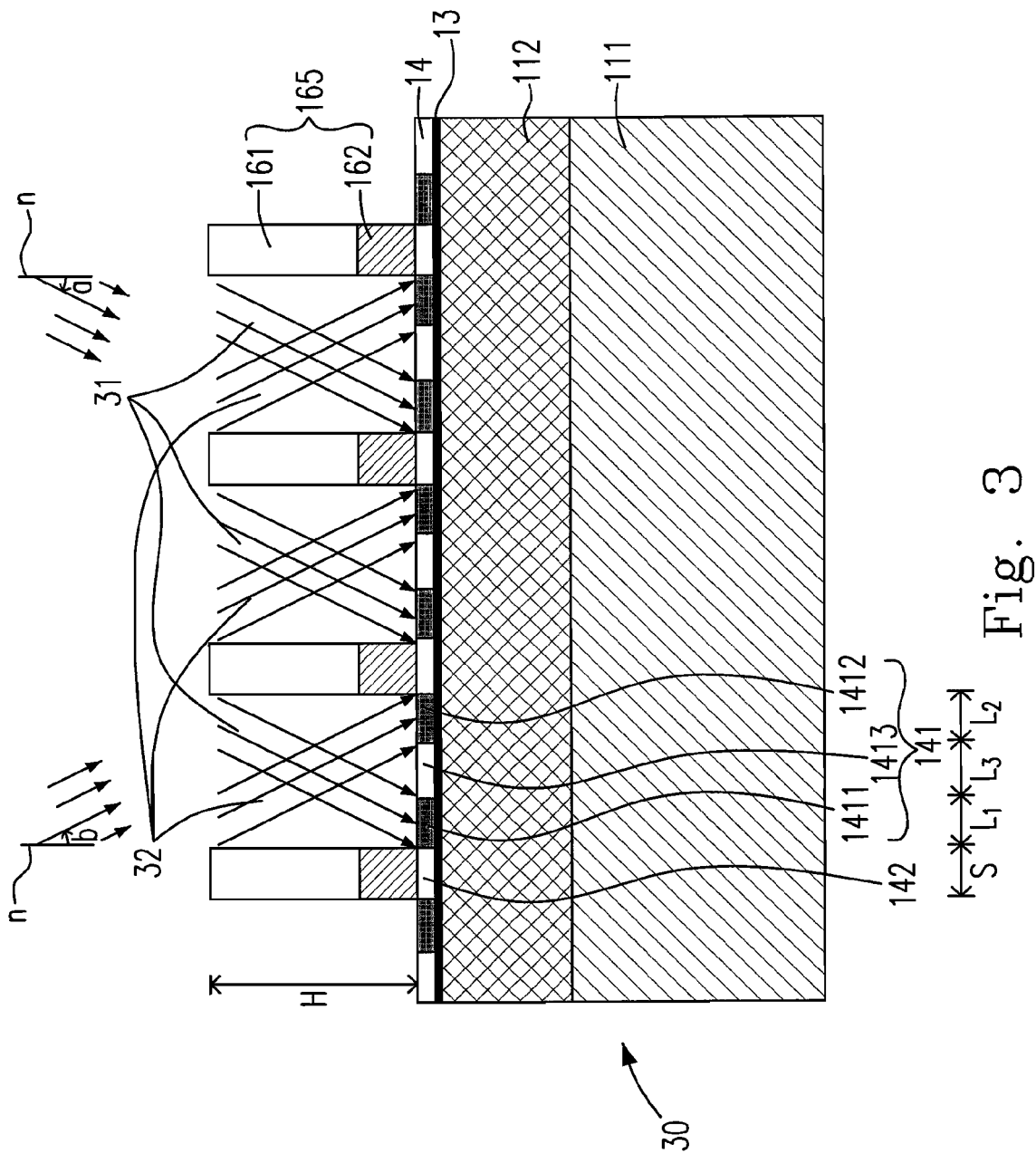
FIG. 3 is a diagram illustrating a lateral profile for the doped semiconductor structure made by an ion implantation process according to the present invention.

Subsequently, please refer to FIG. 3, which is a diagram illustrating a lateral profile for the doped semiconductor structure made by an ion implantation process according to the present invention. At least twice the ion implantation processes are preformed at this stage. First, a first ion implantation process is performed so as to implant a first group of ions 31 into the bottom area 141 with a first incidence a to form a first doped area 1411, wherein the first incidence a is an angle between the incident path of the first group of ions 31 and the normal line n on the surface of the first etching layer 14. The entry of the first group of ions 31 into the first doped area 1411 is with a certain incidence, so that some of the ions would be hampered by the photoresist wall 165 and could not be implanted into the bottom area 141 of the first etching layer 14. Through well controlling the height of the photoresist wall 165 and the first incidence a, the first group of ions 31 could be merely implanted into a part of the first etching layer 14 for forming the first doped 1411. Equally, a second ion implantation process is then performed so as to implant a second group of ions 32 into the bottom area 141 with a second incidence b to form a second doped area 1412, wherein the second incidence b is an angle between the incident path of the second group of ions 32 and the normal line n on the surface of the first etching layer 14. Each of the first and the second group of ions is one selected from a group consisting of a phosphate ion, an arsenic ion, an inert gas ion and a combination thereof. Typically, the first group of ions 31 and the second group of ions 32 could be the same kind or the different kind and the first doped area 1411 and the second doped area 1412 are not adjacent to each other and a reserved area 1413 is formed therebetween. The first doped area 1411 is independent from or apart from the second doped area 1412 and the first incidence a is independent from the second incidence b. None of the ions implanted is in the reserved area 1413. Therefore, the doped semiconductor structure 30 in FIG. 3 is thus formed. It is noted that a plurality of ion implantation processes, each of which has an incidence independent from the others, could be performed at this stage, so as to form a plurality of doped areas in the first etching layer 14 independent from one another.

Figure 4:
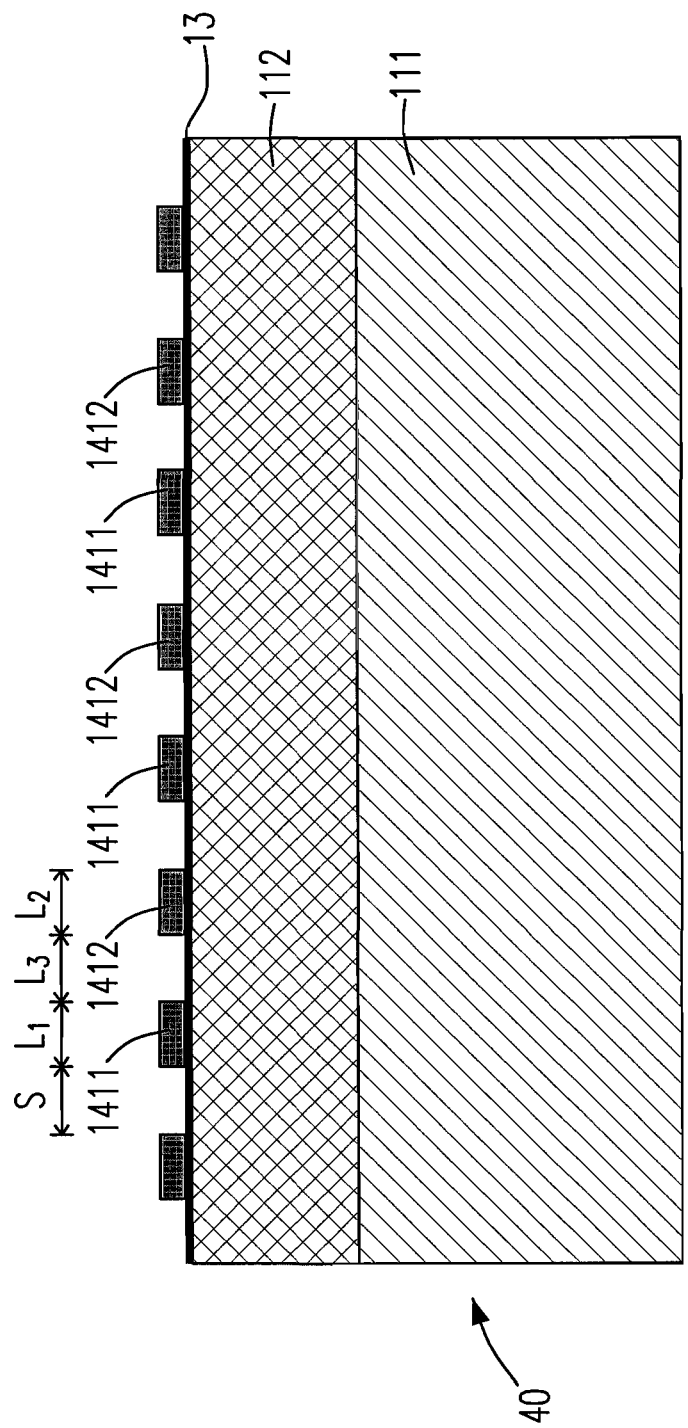
FIG. 4 is a diagram illustrating a lateral profile for the first etched semiconductor structure made by a first etching process according to the present invention.

Subsequently, please refer to FIG. 4, which is a diagram illustrating a lateral profile for the first etched semiconductor structure made by a first etching process according to the present invention. In FIG. 4, the photoresist wall 165, the covered area 142 and the reserved area 1413 of the first etching layer 14 included in the first etched semiconductor structure 40 are removed so that the first doped area 1411 and second doped area 1412 are left behind and a surface of the protecting layer 13 are thus revealed. The photoresist wall 165, the covered area 142 and the reserved area 1413 could be removed by the conventional etching scheme or the chemical mechanical polishing (CMP) scheme.

In one of the preferred embodiments to improve the lithography resolution according to the present invention, the opening 21 has a width L three times larger than the width S of the photoresist wall 165 (of the covered area 142). In the first ion implantation process and the second ion implantation process, Through well controlling the height H of the photoresist wall 165, the first incidence a and the second incidence b, the dimensions of the surface width L1 of the first doped area 1411, the surface width L2 of the second doped area 1412 and the surface width L3 of the reserved area 1413 could become all the same, which is also simultaneously the same with the width S of the photoresist wall 165. That is, after the first etching process is performed, the first doped area 1411 and the second doped area 1412 are distributed very regularly, which could substantially improve the lithography resolution for the succeeding process and broadens the applicable field thereof.

Figure 5:
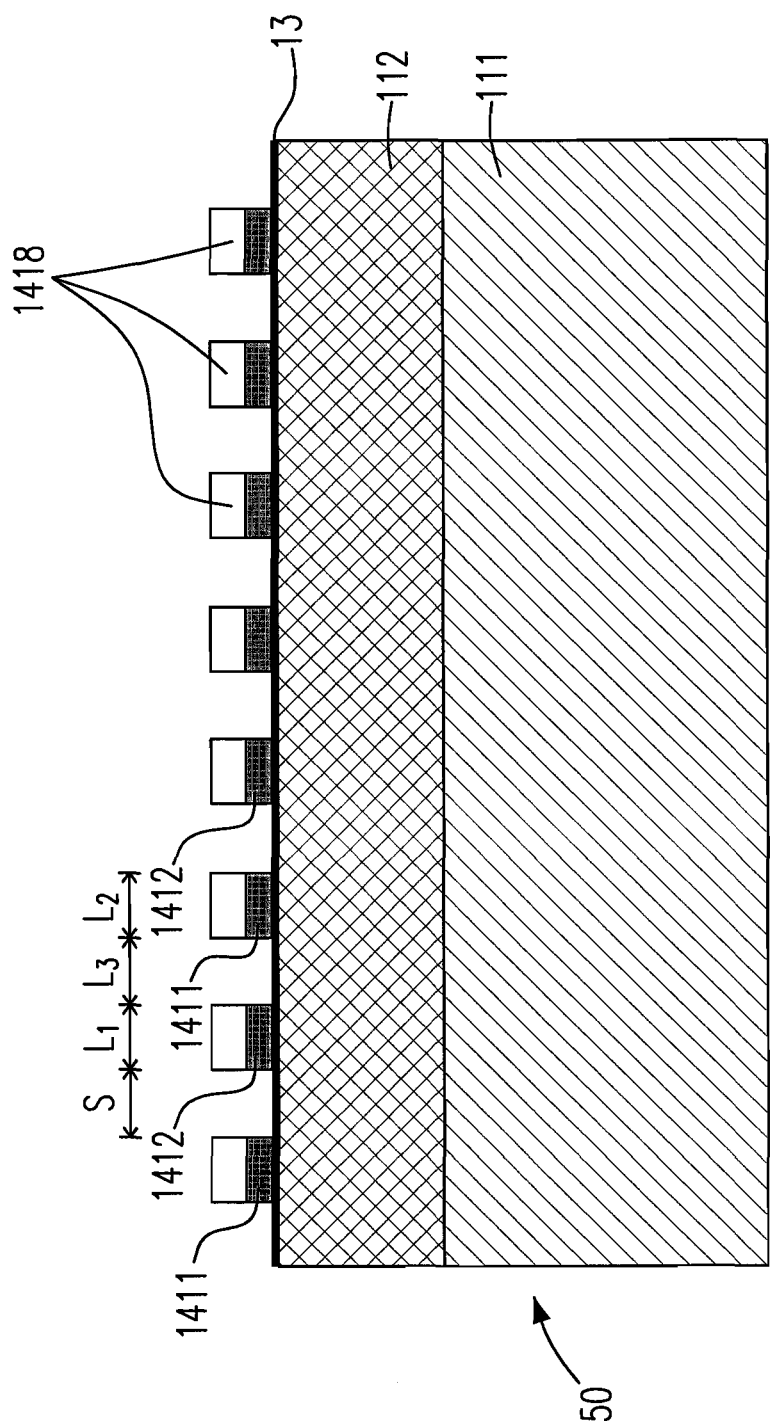
FIG. 5 is a diagram illustrating a lateral profile for the oxidized semiconductor structure made by an oxidation process according to the present invention.

Subsequently, please refer to FIG. 5, which is a diagram illustrating a lateral profile for the oxidized semiconductor structure made by an oxidation process according to the present invention. In FIG. 5, for the oxidized semiconductor structure 50, an insulating layer 1418 is formed on the first doped area 1411 and the second doped area 1412 by a conventional oxidation process, wherein the material of the insulating layer 1418 is, for example, silicon dioxide.

Subsequently, please refer to FIG. 6, which is a diagram illustrating a lateral profile for the second etched semiconductor structure made by a second etching process according to the present invention. A part of the protecting layer 13 and a part of the second etching layer 112 are removed via a dry etching scheme in which the insulating layer 1418 is deemed as a hard mask therein. Therefore, the second etched semiconductor structure 60 in FIG. 6 is thus formed.

Figure 6:
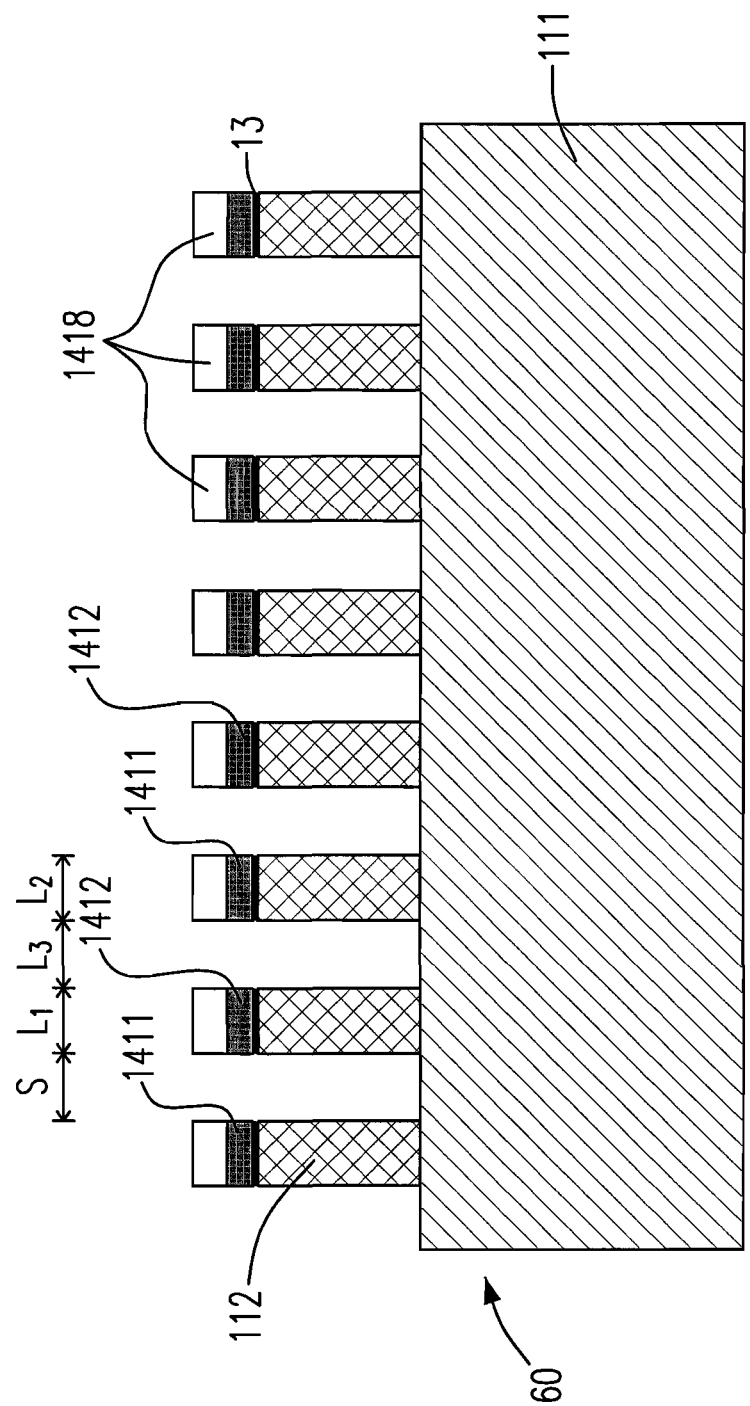
FIG. 6 is a diagram illustrating a lateral profile for the second etched semiconductor structure made by a second etching process according to the present invention.

Through performing the preceding processes, a pattern formed on the base 111 in FIG. 6 finer than that original formed on the first etching layer 14 that is above the base 111 in FIG. 2 could be available.

It is unnecessary to use the same material for the first etching layer 14 and the second etching layer 112, as long as the material adopted respectively in the doped area (the first doped area 1411 and the second doped area 1412) and the non-doped area (the reserved area 1413) have the different etching selective ratio, the material could be used in the first etching layer 14, and as long as the material adopted respectively in the first etching layer 14 on the insulating layer 1418 and the second etching layer 112 have the different etching selective ratio, the material could be used in the second etching layer 112.

In one of the preferred embodiments to improve the lithography resolution according to the present invention, the thickness of the photoresist layer 16 is approximately 154 nm, which includes the thickness of the BARC layer 162 thereunder is approximately 44 mm, the thickness of the first etching layer 14 is approximately 15 nm, the thickness of the protecting layer 13 is approximately 3 nm and the thickness of the second etching layer 112 is approximately 95 nm.

Figure 7:
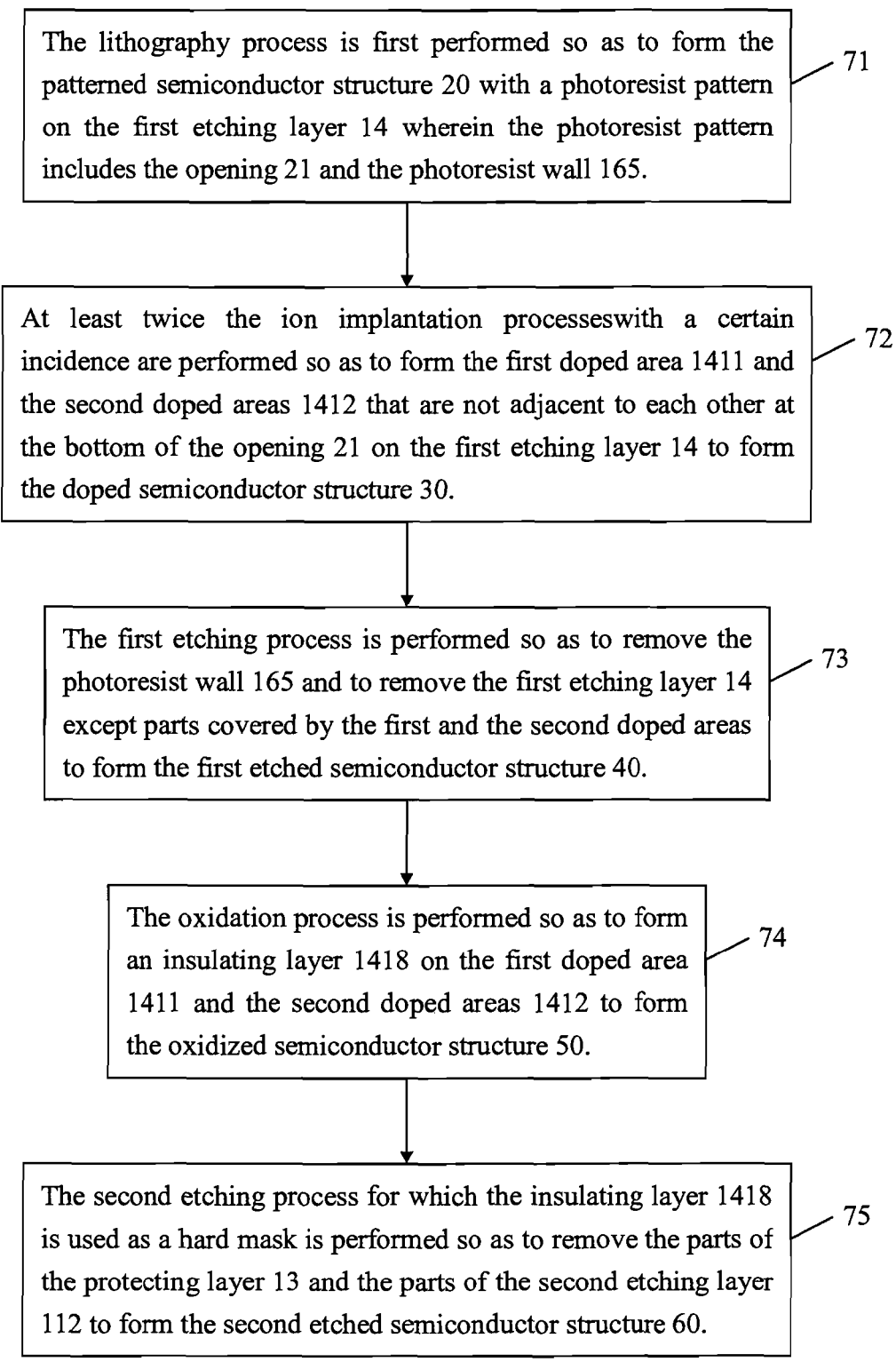
FIG. 7 is a flow chart illustrating the method for improving a lithography resolution according to the present invention.

Please refer to FIG. 7, which is a flow chart illustrating the method for improving a lithography resolution according to the present invention. The above-mentioned processes could be summed up as follows. In FIG. 7, as described in the step 71, the lithography process is first performed so as to form the patterned semiconductor structure 20 with a photoresist pattern on the first etching layer 14 wherein the photoresist pattern includes the opening 21 and the photoresist wall 165; subsequently, as described in step 72, at least twice the ion implantation processes (the first and the second ion implantation processes) with a certain incidence are performed so as to form the first doped area 1411 and the second doped areas 1412 that are not adjacent to each other at the bottom of the opening 21 on the first etching layer 14 to form the doped semiconductor structure 30; subsequently, as described in step 73, the first etching process is performed so as to remove the photoresist wall 165 and to partially remove the first etching layer 14, that is to remove the first etching layer 14 except parts covered by the first and the second doped areas to form the first etched semiconductor structure 40; subsequently, as described in step 74, the oxidation process is performed so as to form an insulating layer 1418 on the first doped area 1411 and the second doped areas 1412 to form the oxidized semiconductor structure 50; subsequently, as described in step 75, the second etching process for which the insulating layer 1418 is used as a hard mask is performed so as to remove the parts of the protecting layer 13 and the parts of the second etching layer 112 to form the second etched semiconductor structure 60. Finally, a finer pattern with high resolution is formed on the base 111.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims that are to be accorded with the broadest interpretation, so as to encompass all such modifications and similar structures. According, the invention is not limited by the disclosure, but instead its scope is to be determined entirely by reference to the following claims.

What is claimed is:

1. A method of improving lithography resolution on a semiconductor, consisting of the sequential steps of:
   (1) providing a substrate on which a protecting layer, a first etching layer and a photoresist layer are sequentially formed;
   (2) patterning the photoresist layer to form an opening with a dimension so as to partially reveal the first etching layer with an area covered by the photoresist layer, wherein the dimension is at least three times larger than that of the covered area;
   (3) implanting a first ion into the revealed first etching layer to form a first doped area; and
   (4) implanting a second ion into the revealed first etching layer to form a second doped area,
   wherein the first doped area is independent of the second doped area,
   wherein all of the above-mentioned steps are performed at an initial photolithographic stage.

2. The method according to claim 1, wherein the substrate is formed by a base and a second etching layer, the second etching layer is formed on the base, and the protecting layer is formed on the second etching layer.

3. The method according to claim 2 further comprising steps of:
   removing the photoresist layer; and
   partially removing the first etching layer to reveal the protecting layer.

4. The method according to claim 3 further comprising steps of:
   forming an insulating layer on the first doped area and the second doped area respectively; and
   partially removing the protecting layer and the second etching layer.

5. The method according to claim 4, wherein the insulating layer is formed by an oxidation process.

6. The method according to claim 1, wherein the first doped area has a first width and the second doped area has a second width which is the same as that of the first width.

7. The method according to claim 1, wherein the first etching layer has a covered area formed under the patterned photoresist layer and a reserved area formed between the first doped area and the second doped area.

8. The method according to claim 7, wherein the first doped area, the second doped area, the covered area and the reserved area are formed with an identical width.

9. The method according to claim 1, wherein the photoresist layer comprises an anti-reflection coating on the first etching layer.

10. The method according to claim 1, wherein each of the first ion and the second ion is selected from a group consisting of a phosphate ion, an arsenic ion, an inert gas ion and a combination thereof.

11. A method of manufacturing a semiconductor device, consisting of the sequential steps of:
    (1) patterning a photoresist layer to form an opening with a dimension so as to partially reveal an etching layer with an area covered by the photoresist layer thereunder, wherein the dimension is at least three times larger than that of the covered area;
    (2) implanting a first ion into the revealed etching layer with a first incidence to form a first doped area; and
    (3) implanting a second ion into the revealed etching layer with a second incidence to form a second doped area, wherein the first doped area is apart from the second doped area,
    wherein all of the above-mentioned steps are performed at an initial photolithographic stage.

12. The method according to claim 11, wherein the etching layer is formed on a protecting layer disposed on a substrate.

13. The method according to claim 11, wherein the first incidence is independent of the second incidence.

14. A method of manufacturing a semiconductor device, consisting of the sequential steps of:
    (1) patterning a photoresist layer to form an opening with a dimension so as to partially expose an etching layer with an area covered by the photoresist layer thereunder, wherein the dimension is at least three times larger than that of the covered area; and
    (2) performing a plurality of ion implantation processes each with an incidence independent of the others to form a plurality of doped areas in the etching layer independent of one another,
    wherein all of the above-mentioned steps are performed at an initial photolithographic stage.

* * * * *